United States Patent [19]
Takemura

[11] Patent Number: 5,923,082
[45] Date of Patent: Jul. 13, 1999

[54] IC CARD READING/WRITING DEVICE

[75] Inventor: Hisao Takemura, Kawasaki, Japan

[73] Assignee: Kabushiki Kaisha Toshiba, Kawasaki, Japan

[21] Appl. No.: 09/168,289

[22] Filed: Oct. 8, 1998

Related U.S. Application Data

[62] Division of application No. 08/748,828, Nov. 14, 1996, Pat. No. 5,850,103.

[30] Foreign Application Priority Data

Nov. 17, 1995 [JP] Japan .................................. 7-299949

[51] Int. Cl.⁶ ..................................................... H01L 23/02
[52] U.S. Cl. ............................................ 257/679; 235/492
[58] Field of Search .............................. 257/679; 235/492

[56] References Cited

U.S. PATENT DOCUMENTS 5,650,916  7/1997  Osaki et al. .
5,674,080  10/1997  Takemura .
5,739,515  4/1998  Takemura .
5,850,103  12/1998  Takemura ................................ 257/679

Primary Examiner—Harold I. Pitts
Attorney, Agent, or Firm—Pillsbury Madison & Sutro LLP

[57] ABSTRACT

An IC card reading/writing device comprises a main body and a conductive cover member. The main body includes a first and a second member which define space for storing an IC card, and can be removably inserted into that storage section of an information processing device which is intended to store a standard card and which has earthing members. The first and second members of the main body and the IC card inserted in the space constitutes a unit having a size and an outer shape which are substantially identical to those of the standard card. The conductive cover member covers the entire outer peripheral portion of the first member, and contacts the earthing members when the main body is located in the storage section.

8 Claims, 4 Drawing Sheets

IC CARD READING/WRITING DEVICE

This is a division of application Ser. No. 08/748,828, filed Nov. 14, 1996 now U.S. Pat. No. 5,850,103.

BACKGROUND OF THE INVENTION

1. Field of the Invention

The present invention relates to an IC card reading/writing device which reads data from and writes data to a IC card or the like.

2. Description of the Related Art

In order to read data from an IC card and write data thereinto, it is necessary to insert the IC card into an IC card reading/writing device.

A conventional IC card reading/writing device is connected to a computer device when it is used. To be more specific, the reading/writing device is located outside the computer device and connected to an interface thereof, e.g., RS-232C, by a connector cable. As disclosed in Jpn. Pat. Appln. KOKOKU Publication No. 4-38027, the reading/writing device can hold an IC card in it in a predetermined position. The device is shaped like a box and is relatively large in thickness since it includes an internal member, such as a vertically movable contact holder for holding contact pins which are to be put into contact with the IC incorporated in the card.

Therefore, the conventional IC card reading/writing device has disadvantages. First, the reading/writing device needs a connecter cable to be connected to the computer device. Second, as mentioned above, the reading/writing device is located outside the computer device when it is used. Therefore, the reading/writing device cannot be used if there is not sufficient space outside the computer device for the reading/writing device.

Moreover, conventional IC card reading/writing devices are large. As a result, the reading/writing device cannot be inserted into the storage space provided in a computer device for storing a standard card. Hence, the reading/writing device cannot be used in the computer device. Needless to say, the reading/writing device cannot be inserted into a portable compact computer device. Thus, the reading/writing device must be carried independently of the portable compact computer device.

SUMMARY OF THE INVENTION

The present invention has been developed in consideration of the above circumstances. The object of the present invention is to provide an IC card reading/writing device which has a small thickness, and can be used in a portable compact computer device (information processing device). The IC card reading/writing device does not need a connector cable for use in connection between the reading/writing device and the computer device, or space for location of the reading/writing device outside the computer device. Furthermore, the reading/writing device can be inserted into and removed from the storage section of the information processing device and can be reliably grounded by the information processing device.

The above object is accomplished by an IC card reading/writing device comprising:

a main body including a first member and a second member which are located opposite to each other, defining space for storing an IC card, the first and second members and the IC card inserted in the space constituting a unit having a size and an outer shape which are substantially identical to a size and an outer shape of a standard card, and the main body capable of being removably inserted into that storage section of an information processing apparatus which is provided for storing the standard card and which has earthing members; and a conductive cover member covering an entire outer peripheral portion of the first member, and contacting the earthing members as long as the main body remains inserted in the storage section.

The object is also accomplished by an IC card reading/writing device comprising:

a main body capable of being removably inserted into that storage section of an information processing apparatus which is provided for storing a standard card and which has projections, the main body including a first member, a second member, and a step portion which is put into contact with the projections of the storage section of the information processing apparatus when the main body is removed from the storage section, the first and second members being located opposite to each other, with the step portion interposed between end portions of the first and second members on an insertion side of the main body from which the main body is inserted into the storage section, the first and second members and the step portion defining space for storing an IC card, and the first and second members and the IC card inserted in the space constituting a unit having a size and an outer shape which are substantially identical to a size and an outer shape of the standard card; and guide surfaces formed on the step portion of the main body such that the guide surfaces are inclined, the guide surfaces guiding the projections in a direction where the projections are detached from the step portion, when the main body is removed from the storage section and the step portion is put into contact with the projections.

According to the present invention, the size and outer shape of the IC card reading/writing device are substantially identical to those of the standard card. The device can be inserted into the storage section of the information processing apparatus, for storing the standard card. The device enables the IC card to be used in the information processing apparatus such as a portable personal computer in which the standard card is usable. Furthermore, the following advantages are obtained:

It can be considered that the positions of the earthing members within the storage section vary from one information processing apparatus to another. However, the device of the present invention is reliably grounded regardless of the positions of the earthing members within the storage section of the information processing apparatus. This is because the conductive cover, as mentioned above, covers the entire outer peripheral portion of the first member.

In addition, when the main body is removed from the storage section of the information processing apparatus, and the step portion is put into contact with the projections of the storage section, the projections are guided along the guide surfaces of the step portion, and detached from the step portion. By virtue of this feature, the device prevents the projections from being caught by the step portion.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

The present invention will be explained in detail with reference to the accompanying drawings.

Figure 1:
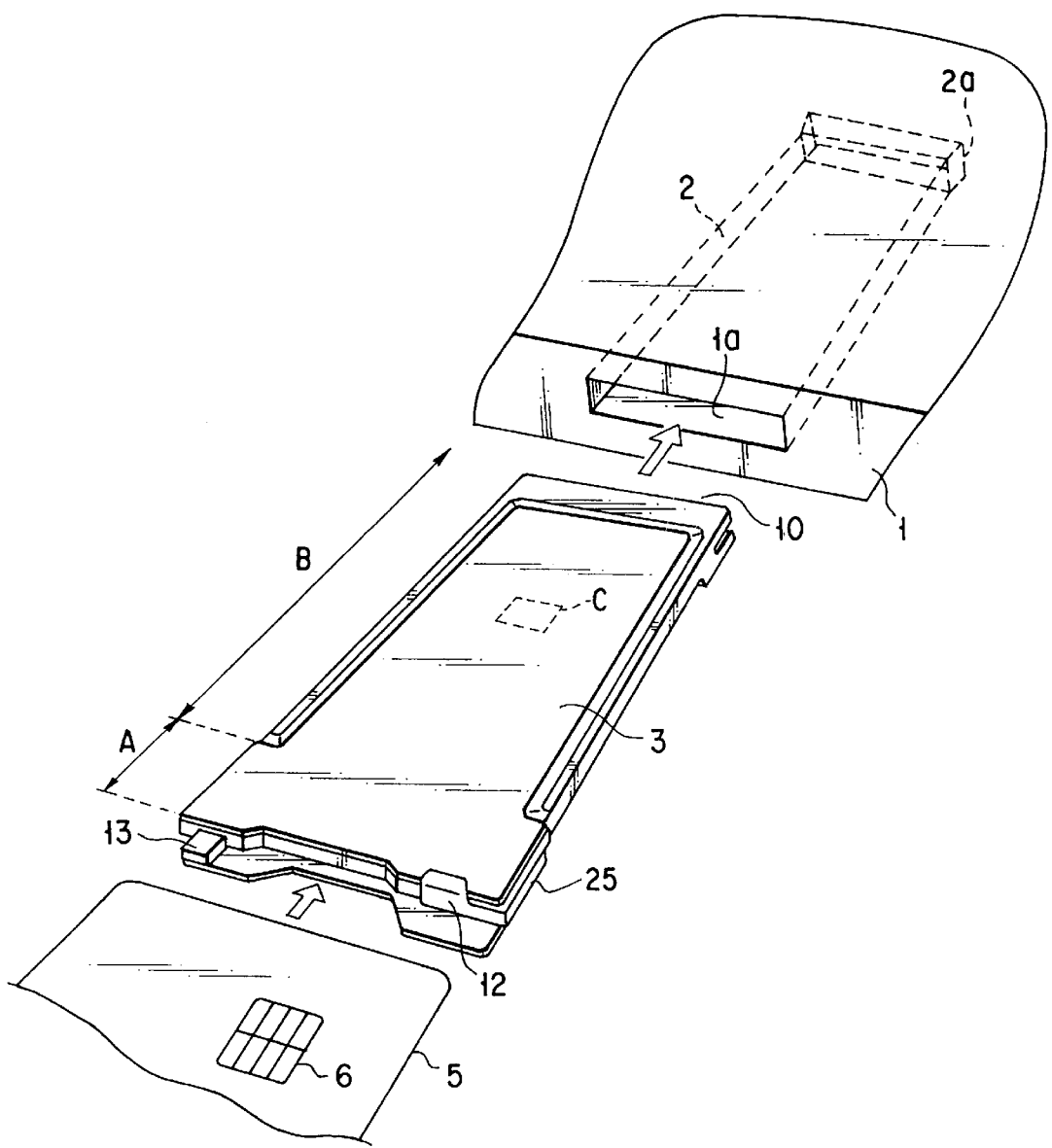
FIG. 1 is a perspective view showing an IC card, an IC card reading/writing device and a portable personal computer device in the first embodiment of the present invention.

FIG. 1 shows the first embodiment of the present invention. To be more specific, it shows an IC card 5, an IC card reading/writing device 3, and a computer device 1 functioning as an information processing device, such as a notebook-type personal computer.

The computer device 1 includes: a front portion having an insertion slot 1a for allowing a card-type device to be inserted into the computer device 1; a card storage section 2 for storing a PC card used as a standard card such as a memory card; and a connector 2a for the PC card. The card storage section 2 has a shape and dimensions in accordance with a standard card.

The IC card reading/writing device 3 has a light emitting diode (LED) 12, an eject button 13, and a connector portion 10 to be electrically connected to the connector 2a of the computer device 1. The connector portion 10 is formed on an insertion side (front side) of the device 3 from which the device 3 is inserted into the computer device 1, and the LED 12 and the eject button 13 are formed on a terminal end side (rear side) of the device 3. The device 3 is inserted through the insertion slot 1a, and located in the card storage section 2.

An integrated circuit having terminals 6 are provided on one side of the IC card 5 to be inserted into the device 3.

Figure 2:
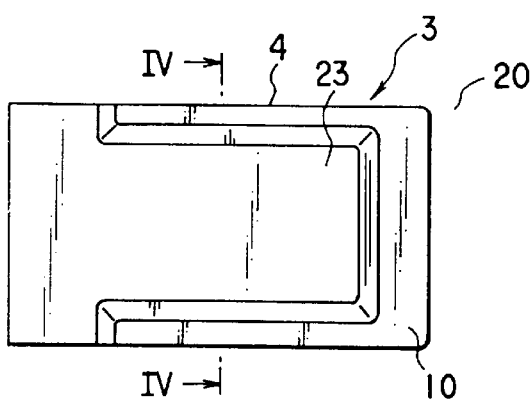
FIG. 2 is a plan view of the IC card reading/writing device.
Figure 3:
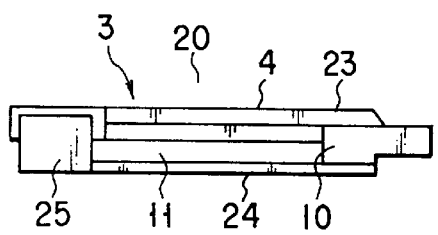
FIG. 3 is a side view of the IC card reading/writing device.
Figure 4:
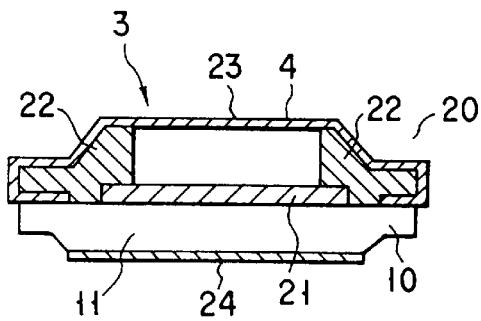
FIG. 4 is a cross-sectional view taken along line IV—IV of FIG. 2.

FIGS. 2 to 4 show the IC card reading/writing device 3. To be specific, FIG. 2 is a plan view of the device 3, FIG. 3 is a side view of the device 3, and FIG. 4 is a cross-sectional view taken along line IV—IV of FIG. 2.

As shown in FIG. 4, the device 3 has a main unit 4 used as a first member, which includes a main frame 21 and an upper cover frame 22 attached to the main frame 21. The upper portion and side portions of the upper cover frame 22 are covered by a conducive upper cover 23 used as a cover member formed of a conductive material. In other words, the entire outer peripheral portion of the upper cover frame 22 is covered by the conductive upper cover 23.

A contact block C and a removing mechanism (not shown), etc. are located in the main unit 4. The contact block comprises eight pins which contact the terminals 6 of the IC card 5, and the removing mechanism is designed to remove the IC card 5 from the device 3.

A main body 20 of the device 3 has the following structure:

A base frame 24 used as a second member and formed of metal is located opposite to the main frame 21. On the front side of the device 3, the end portions of the main frame 21 and base frame 24 are connected to each other by the connector portion 10 used as a step portion. On the rear side of the device 3, the other end portions of the main frame 21 and base frame 24 are connected to each other by a connection portion 25 used as a projection portion A, which is projected from the card storage section 2 when the device 3 is inserted in the computer device 1. The main frame 21, the base frame 24, the connector portion 10 and the connection portion 25 define side openings. In other words, the side openings are provided on the both sides of the main body 20. The width of the main unit 4 is substantially equal to the width of the connector portion 10, and the thickness of the main unit 4 is smaller than that of the connector portion 10.

The base frame 24 is designed to mainly protect the bottom surface of the IC card 5, and enable the contact block and the terminals 6 of the IC card 5 to reliably contact each other. The main frame 21 is separated from the base frame 24 by 0.76 mm or more, and a storage space 11 for use in storing the IC card is provided between the main frame 21 and the base frame 24. The width of the main unit 4 is 54 mm, and the width of the base frame 24 is 48 mm or less.

The greater part of the IC card reading/writing device 3 has a shape and dimensions according to the standard of a card-type device. To be specific, the device 3 has a thickness of 5 mm or less and a width of 54 mm which is equal to that of an IC card on which a large scale integrated circuit (LSI) is mounted.

When the IC card 5 is inserted into the storage space 11 of the device 3, the size and shape of a combination of the IC card 5 and that portion B of the device 3 which is to be inserted into the computer device 1 are substantially identical to those of a standardized card-type device.

Therefore, the device 3 can be inserted through the insertion slot 1a of the computer device 1, and located in the card storage section 2 thereof, with the IC card 5 held in the device 3.

Figure 5:
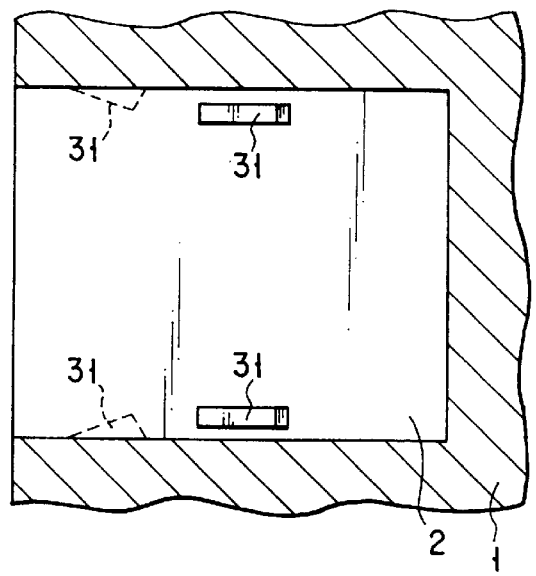
FIG. 5 is a cross-sectional plan view of a storage section of the portable personal computer device.
Figure 6:
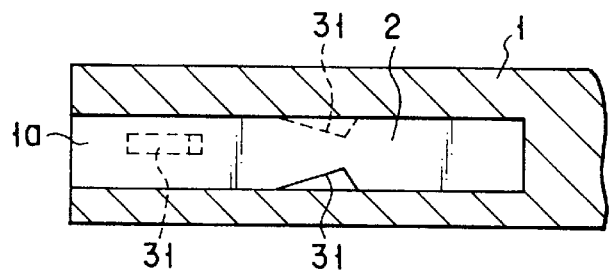
FIG. 6 is a cross-sectional side view of the storage section of the portable personal computer device.
Figure 7:
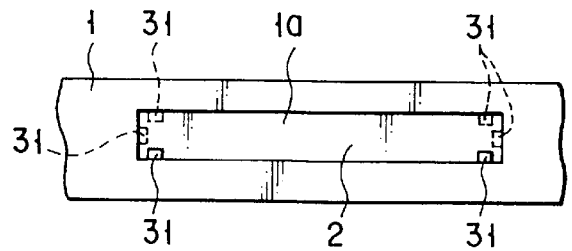
FIG. 7 is a front view of the storage section of the portable personal computer device.

FIGS. 5 to 7 show a pair of earthing members 31 provided in the card storage section 2 of the computer device 1.

The earthing members 31 are formed of spring members, and projected from side areas of the bottom surface of the card storage section 2, the side surfaces of the section 2, or side areas of the top surface of the section 2.

Therefore, in order for the IC card 5 to be used in the portable personal computer device 1, the operation is performed in the following order:

The IC card 5 is inserted into the storage space 11 of the IC card reading/writing device 3. Then, the device 3 is inserted into the card storage section 2 through the insertion slot 1a of the computer device 1. As a result, the connector portion 10 of the device 3 is electrically connected to the connector 2a of the computer device 1, and thus the IC card 5 stored in the device 3 can be used in the computer device 1. In addition, when the device 3 is stored in the card storage section 2 of the computer device 1, the earthing members 31 of the computer device 1 contact the conductive cover 23 covering the upper cover frame 22 of the device 3, as a result of which the device 3 is earthed via the earthing members 31.

In such a manner, the IC card reading/writing device 3 can be inserted into the card storage section 2 of the portable personal computer device 1, for storing the standard card such as a standardized memory card. In other words, the device 3 can be used in the computer device 1. Thus, the computer device 1 can be carried, with the device 3 inserted therein. In addition, the device 3 can be used regardless of whether or not there is space for location of the device 3 outside the computer device 1. Therefore, the device 3 is far more convenient than conventional IC reading/writing devices.

Furthermore, the earthing members 31 of the computer device 1, as mentioned above, are projected from the side areas of the bottom surface of the card storage section 2, the side surfaces of the section 2, or the side areas of the top surface of the section 2. However, the device 3 is reliably grounded by the earthing members 31, even if the earthing members 31 are located in any of the above positions. This is because the conductive cover 23 covers the entire outer peripheral portion of the upper cover frame 22 of the device 3, and thus the conductive cover 23 of the device 3 can reliably contact the earthing members 31.

Figure 8:
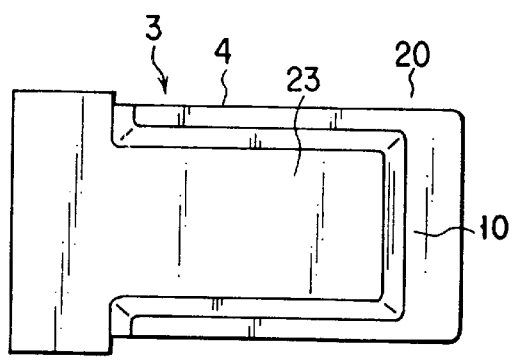
FIG. 8 is a plan view of an IC card read/writing device in the second embodiment of the present invention.
Figure 9:
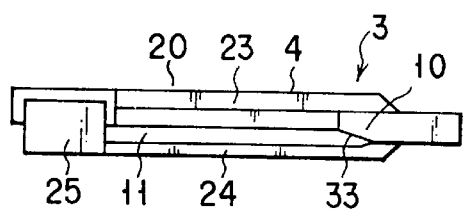
FIG. 9 is a side view of the IC card reading/writing device.
Figure 10:
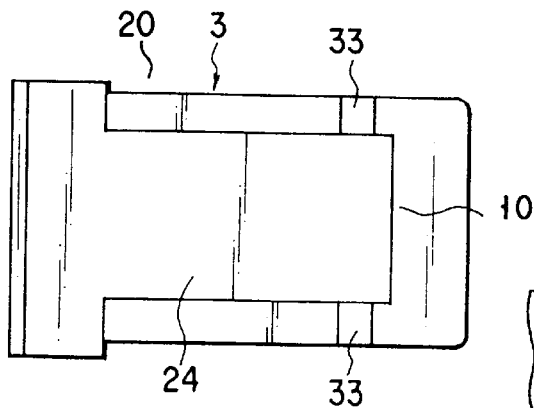
FIG. 10 is a bottom view of the IC card reading/writing device.

FIGS. 8 to 10 illustrate the second embodiment of the present invention.

FIG. 8 is a plan view of an IC card reading/writing device, FIG. 9 is a side view of the device, and FIG. 10 is a bottom view of the device.

The same structural elements of the second embodiment that have already been discussed in the first embodiment are denoted by the same reference numerals, and the explanations therefor will be omitted.

In the second embodiment, on the front side of the IC card reading/writing device 3, the end portions of base frame 24 and main frame 4 are connected to each other by the connector portion 10 used as the step portion. The bottom portion of the connector portion 10 includes inclined surfaces 33 serving as guiding surfaces, which are formed on side areas of the bottom portion, and inclined downwards in an insertion direction where the device 3 is inserted into the computer device 1. In other words, the connector portion 10 has stepped portions each of which is connected to the main frame 4 and has a thickness differing from the thickness of the main frame 4 and gradually decreasing in the opposite direction of the insertion direction.

Figure 11:
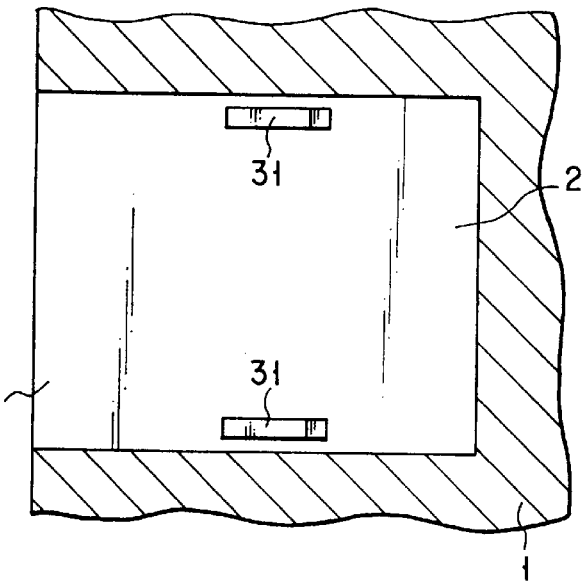
FIG. 11 is a cross-sectional plan view of a storage section of a portable personal computer device.
Figure 12:
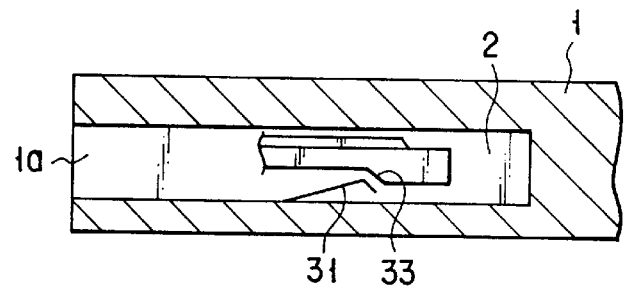
FIG. 12 is a cross-sectional side view of the storage section of the portable personal computer device.
Figure 13:
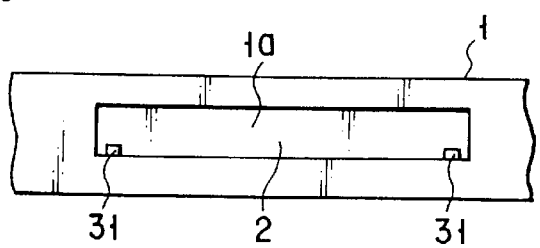
FIG. 13 is a front view of the storage section of the portable personal computer device.

Furthermore, the earthing members 31, as shown in FIGS. 11 to 13, are projected from the side areas of the bottom surface of the card storage section 2 of the computer device 1. When the device 3 is removed from the card storage section 2 of the computer device 1, the inclined surfaces 33 of the device 3 and the earthing members 31 of the computer device 1 are put into contact with each other, and the earthing members 31 are slid along the inclined surfaces 33, and then detached downwards from the connector portion 10.

By virtue of the above structure, the connector portion 10 of the IC card reading/writing device 3 is not caught by the earthing members 31 of the computer device 1, and thus the device 3 can be removed smoothly from the computer device 1.

Figure 14:
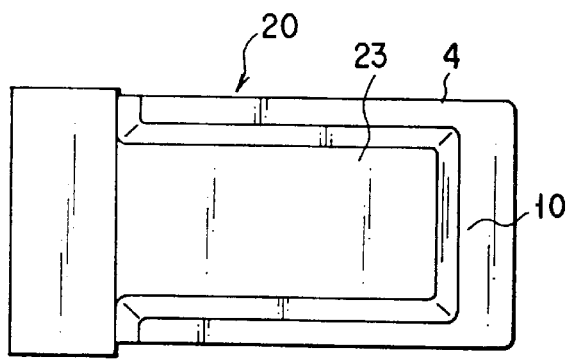
FIG. 14 is a plan view of an IC card reading/writing device in the third embodiment of the present invention.
Figure 15:
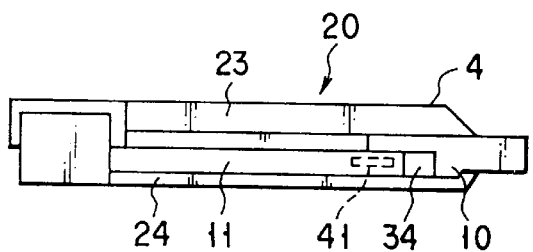
FIG. 15 is a side view of the IC card reading/writing device.
Figure 16:
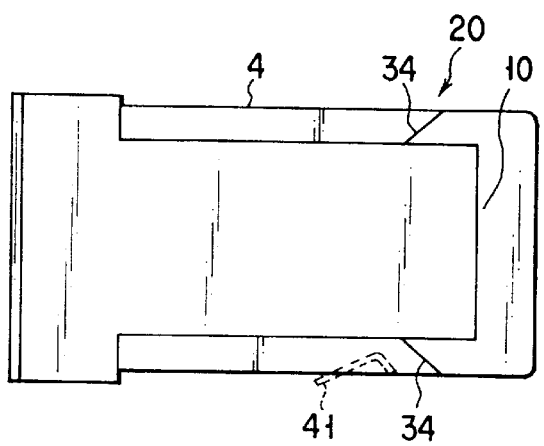
FIG. 16 is a bottom view of the IC card reading/writing device.

FIGS. 14 to 16 illustrate the third embodiment of the present invention.

In the third embodiment, inclined surfaces 34 serving as guiding surfaces are provided on side areas of the connector portion 10 which are used as the step portion and interposed between the end portions of the main frame 4 and base frame 24.

A left one of the inclined surfaces 34 is inclined leftwards in the insertion direction of the device 3, and a right one of the inclined surfaces 34 is inclined rightwards in the insertion direction.

Furthermore, in the third embodiment, projections 41 are projected from the side surfaces of the card storage section 2 of the computer device 1. When the IC card reading/writing device 3 is removed from the card storage section 2, the inclined surfaces 34 of the connector portion 10 of the device 3 and the projections 41 of the computer device 1 are put into contact with each other such that the projections 41 are slid along the inclined surface 34, and then the projections 41 are detached sidewards from the connector portion 10.

Therefore, the IC card reading/writing device 3 is not caught by the projections 41, and thus can be smoothly removed from the computer device 1.

Figure 17:
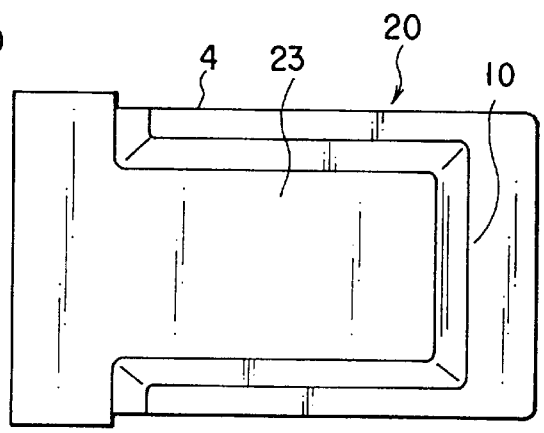
FIG. 17 is a plan view of a IC card reading/writing device in the fourth embodiment of the present invention.
Figure 18:
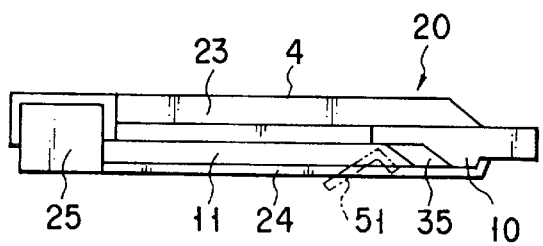
FIG. 18 is a side view of the IC card reading/writing device.
Figure 19:
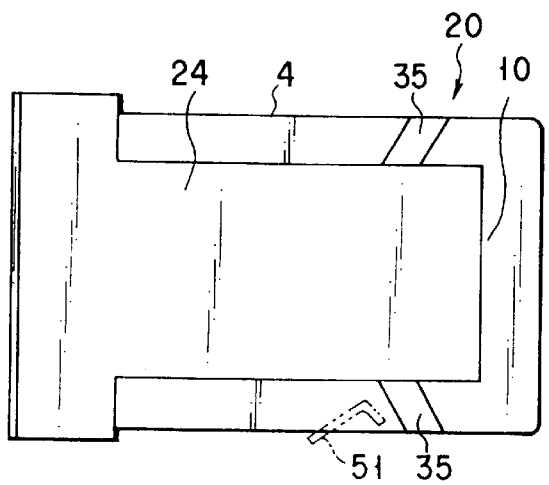
FIG. 19 is a bottom view of the IC card reading/writing device.

FIGS. 17 to 19 illustrate the fourth embodiment of the present invention.

In the fourth embodiment, inclined surfaces 35 serving as guiding surfaces are formed on the bottom portion and left and right side portions of the connector portion 10 which are used as the step portion and interposed between the end portions of the main frame 4 and base frame 24.

The inclined surfaces 35 formed on the bottom portion are inclined downwards, the inclined surface 35 formed on the left side portion is inclined leftwards and the inclined surface 35 formed on the right side portion is inclined rightwards, in the insertion direction where the main body 20 is inserted into the storage section of the information processing apparatus. A left one of the inclined surfaces 35 formed on the bottom portion is continuous with the inclined surface 35 formed on the left side portion, and a right one of the inclined surfaces 35 formed on the bottom portion is continuous with the inclined surface 35 formed on the right side portion.

By virtue of the above structural feature of the fourth embodiment, the IC card reading/writing device 3 has the following advantage:

As mentioned above, the projections 51 of the computer device 1 are projected from the side surfaces of the card storage section 2 of the computer device 1 or the side areas of the card storage section 2. Therefore, when the device 3 is removed from the card storage section 2, and the connector portion 10 is put into contact with the projections 51, the projections 51 are guided along the inclined surfaces 35, and then detached from the connector portion 10. Thus, the device 3 is not caught by the projections 51, and thus can be smoothly removed from the card insertion section 2.

As explained above, according to the present invention, when the IC card 5 is stored in the storage space 11 defined between the main frame 4 and the base frame 24, the size and outer shape of a combination of the main frame 4, the base frame 24 and the IC card are substantially identical to those of the standard card. In other words, the main body 20 is considerable small in thickness, and can be inserted into the card storing section 2 of the computer device 1.

Thus, the IC reading/writing device 3 enables the IC card 5 to be used in the information processing apparatus such as a portable personal computer in which the standard card is usable. Therefore, the device 3 is remarkably convenient.

Furthermore, it can be considered that the positions of the earthing members 31 in the storage section vary from one information processing apparatus to another. However, the conductive upper cover 23 can be reliably put into contact with the earthing members 31 and thus reliably grounded, regardless of the positions of the earthing members 31 within the storage section 2 of the computer device 1. This is because the conductive upper cover 23 covers the entire outer peripheral portion of the main frame 4 of the main body 20.

In addition, as stated above, the inclined surfaces 33, the inclined surfaces 34 or the inclined surfaces 35 are formed on the connector portion 10 of the main body 20. Thus, the earthing members 31, the projections 41, or the projections 51 in the card storage section 2 are moved along the inclined surfaces 33, the inclined surfaces 34, or the inclined surfaces 35, and detached from the connector portion 10, when the main body 20 is removed from the information processing apparatus, and the connector portion 10 is put into contact with the earthing members 31, the projections 41 or the projections 51. As a result, the main body 20 is prevented from being caught by the earthing members 31, the projections 41 or the projections 51, and thus smoothly inserted into and removed from the information processing apparatus.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An IC card reading/writing device comprising:
   a main body including a first member and a second member which are located opposite to each other, defining space for storing an IC card, the first and second members and the IC card inserted in the space constituting a unit having a size and an outer shape which are substantially identical to a size and an outer shape of a standard card, and the main body capable of being removably inserted into that storage section of an information processing apparatus which is provided for storing the standard card and which has earthing members; and
   a conductive cover member covering an entire outer peripheral portion of the first member, and contacting the earthing members as long as the main body remains inserted in the storage section.

2. An IC card reading/writing device comprising:
   a main body capable of being removably inserted into that storage section of an information processing apparatus which is provided for storing a standard card and which has projections, the main body including a first member, a second member, and a step portion which is put into contact with the projections of the storage section of the information processing apparatus when the main body is removed from the storage section, the first and second members being located opposite to each other, with the step portion interposed between end portions of the first and second members on an insertion side of the main body from which the main body is inserted into the storage section, the first and second members and the step portion defining space for storing an IC card, and the first and second members and the IC card inserted in the space constituting a unit having a size and an outer shape which are substantially identical to a size and an outer shape of the standard card; and
   guide surfaces formed on the step portion of the main body such that the guide surfaces are inclined, the guide surfaces guiding the projections in a direction where the projections are detached from the step portion, when the main body is removed from the storage section and the step portion is put into contact with the projections.

3. The IC card reading/writing device according to claim 2, wherein the guide surfaces are formed on a bottom portion of the step portion, and inclined downwards in an insertion direction where the main body is inserted into the storage section of the information processing apparatus.

4. The IC card reading/writing device according to claim 2, wherein the guide surfaces are formed on left and right side portions of the step portion, and the guide surface formed the left side portion is inclined leftwards and the guide surface formed on the right side portion is inclined rightwards in an insertion direction where the main body is inserted into the storage section of the information processing apparatus.

5. The IC card reading/writing device according to claim 2, wherein the guide surfaces are formed on a bottom portion and left and right side portions of the step portion, and the guide surfaces formed on the bottom portion are inclined downwards, the guide surface formed on the left side portion is inclined leftwards and the guide surface formed on the right side portion is inclined rightwards, in an insertion direction where the main body is inserted into the storage section of the information processing apparatus, such that a left one of the guide surfaces formed on the bottom portion is continuous with the guide surface formed on the left side portion, and a right one of the guide surfaces formed on the bottom portion is continuous with the guide surface formed on the right side portion.

6. An IC card reading/writing device comprising:
   a main body capable of being removably inserted into that storage section of an information processing apparatus which is for storing a standard card and which has earthing members, the main body including a first member, a second member, and a step portion which is put into contact with the earthing members of the storage section of the information processing apparatus when the main body is removed from the storage section, the first and second members being located opposite to each other, with the step portion interposed between end portions of the first and second members on an insertion side of the main body from which the main body is inserted into the storage section, the first and second members and the step portion defining space for storing an IC card, and the first and second members and the IC card inserted in the space constituting a unit having a size and an outer shape which are substantially identical to a size and an outer shape of the standard card;

a conductive cover member covering an entire outer peripheral portion of the first member, and contacting the earthing members as long as the main body remains inserted in the storage section; and guide surfaces formed on the step portion of the main body such that the guide surfaces are inclined, the guide surfaces guiding the earthing members in a direction where the earthing members are detached from the step portion, when the main body is removed from the storing section and the step portion is put into contact with the earthing members.

7. An IC card reading/writing device comprising:

a main body capable of being removably inserted into that storage section of an information processing apparatus which is provided for storing a standard card and has earthing members, the main body including a first member and a second member which are located opposite to each other, defining space for storing an IC card, and the first and second members and the IC card inserted in the space constituting a unit having a size and an outer shape which are substantially identical to a size and an outer shape of the standard card; and a conductive cover member contacting the earthing members as long as the main body remains inserted in the storing section.

8. An IC card reading/writing device having a contact block to be electrically connected to a connector of that storage section of an information processing apparatus which is provided for storing a standard card, the contact block being to be electrically connected to terminals provided on a surface of an IC card, the IC card reading/writing device comprising:

a main body including a connector portion, a first member and a second member, the connector portion being to be electrically connected to the connector of the storage section of the information processing apparatus, the connector portion having stepped portions each of which is connected to the first member and has a thickness greater than a thickness of the first member and gradually decreasing in a direction opposite to an insertion direction where the IC card reading/writing device is inserted into the information processing apparatus, the first member and the second member being located opposite to each other, defining space for storing the IC card, and having side end opening portions which are provided on both sides of the first and second members, the first member having a width equal to a width of the connector portion, and the second member having a width smaller than the width of the connector portion; and a projection portion located opposite to the connector portion in a longitudinal direction of each of the first and second members, the projection portion being projected from the storage section of the information processing apparatus when the IC card reading/writing device is inserted in the information processing apparatus, and the projection portion connecting the first and second members.

* * * * *